(12) United States Patent
Voldman

(10) Patent No.: US 7,943,437 B2
(45) Date of Patent: May 17, 2011

(54) APPARATUS AND METHOD FOR ELECTRONIC FUSE WITH IMPROVED ESD TOLERANCE

(75) Inventor: Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 12 days.

(21) Appl. No.: 11/871,713

(22) Filed: Oct. 12, 2007

(65) Prior Publication Data

US 2008/0254609 A1    Oct. 16, 2008

Related U.S. Application Data

(62) Division of application No. 11/004,846, filed on Dec. 7, 2004, now Pat. No. 7,334,320, which is a division of application No. 10/707,282, filed on Dec. 3, 2003, now abandoned.

(51) Int. Cl.
*H01L 21/82* (2006.01)

(52) U.S. Cl. .. 438/132; 438/382; 438/601; 257/E21.592

(58) Field of Classification Search ................ 438/601, 438/132, 382, FOR. 433; 257/209, 529, 257/E21.592, E23.149
See application file for complete search history.

(56) References Cited

U.S. PATENT DOCUMENTS

| | | | |
|---|---|---|---|
| 1,036,510 A | 8/1912 | Murray | |
| 2,288,428 A | 6/1942 | Babler | |
| 2,934,627 A | 4/1960 | Bristol et al. | |
| 3,358,363 A | 12/1967 | Jacks et al. | |
| 3,619,725 A * | 11/1971 | Soden et al. | 257/529 |
| 3,810,063 A | 5/1974 | Blewitt | |
| 4,180,596 A * | 12/1979 | Crowder et al. | 438/664 |
| 4,376,927 A | 3/1983 | McGalliard | |
| 4,406,053 A * | 9/1983 | Takasaki et al. | 438/778 |
| 4,518,981 A | 5/1985 | Schlupp | |
| 4,679,310 A * | 7/1987 | Ramachandra et al. | 438/570 |
| 4,706,059 A | 11/1987 | Schmitt | |
| 4,740,485 A * | 4/1988 | Sharpe-Geisler | 438/601 |
| 4,748,491 A | 5/1988 | Takagi | |
| 4,873,506 A | 10/1989 | Gurevich | |
| 5,479,147 A | 12/1995 | Montgomery | |
| 5,527,737 A * | 6/1996 | Jeng | 438/623 |
| 5,677,201 A * | 10/1997 | Kozuka et al. | 438/59 |
| 5,726,621 A | 3/1998 | Whitney et al. | |
| 5,775,940 A | 7/1998 | Tanigawa | |
| 5,790,007 A | 8/1998 | Yasukuni | |
| 5,864,277 A | 1/1999 | Grimm et al. | |

(Continued)

OTHER PUBLICATIONS

W.J. Craig, et al., "On-Chip Electrically Programmable Fuse", IBM Technical Disclosure Bulletin, vol. 29, No. 3, Aug. 1986.

*Primary Examiner* — Matthew S Smith
*Assistant Examiner* — Quovaunda Jefferson
(74) *Attorney, Agent, or Firm* — Anthony Canale; Roberts Mlotkowski Safran & Cole, P.C.

(57) ABSTRACT

Method of making an electronic fuse blow resistor structure. In one embodiment, the method includes forming an insulator film, depositing a conductor on the insulator film, and after the depositing, etching the conductor to form a plurality of spaced apart non-conductive regions and a plurality of spaced-apart conductive regions. In another embodiment, the method includes forming the insulator film, forming a conductive sheet, and sub-dividing the conductive sheet into the plurality of conductive regions.

22 Claims, 8 Drawing Sheets

U.S. PATENT DOCUMENTS

| | | | |
|---|---|---|---|
| 5,882,998 A * | 3/1999 | Sur et al. | 438/601 |
| 5,923,239 A | 7/1999 | Krueger et al. | |
| 5,936,880 A | 8/1999 | Payne | |
| 5,978,133 A * | 11/1999 | Gillich | 359/359 |
| 6,074,940 A * | 6/2000 | Lee et al. | 438/601 |
| 6,078,091 A | 6/2000 | MacPherson et al. | |
| 6,088,256 A | 7/2000 | Worley et al. | |
| 6,147,586 A | 11/2000 | Saitoh et al. | |
| 6,249,037 B1 | 6/2001 | Manning | |
| 6,300,233 B1 * | 10/2001 | Lee et al. | 438/601 |
| 6,368,902 B1 * | 4/2002 | Kothandaraman et al. | 438/132 |
| 6,432,760 B1 | 8/2002 | Kothandaraman et al. | |
| 6,486,527 B1 * | 11/2002 | MacPherson et al. | 257/529 |
| 6,501,107 B1 * | 12/2002 | Sinclair et al. | 257/209 |
| 6,507,087 B1 | 1/2003 | Yu | |
| 6,525,397 B1 | 2/2003 | Kalnitsky et al. | |
| 6,580,156 B1 | 6/2003 | Ito et al. | |
| 6,649,997 B2 * | 11/2003 | Koike | 257/529 |
| 6,710,699 B2 | 3/2004 | Kaltenborn et al. | |
| 6,750,529 B2 | 6/2004 | Mori | |
| 6,897,136 B2 | 5/2005 | Bae | |
| 7,106,164 B2 | 9/2006 | Voldman | |
| 2002/0086462 A1 | 7/2002 | Kothandaraman et al. | |
| 2002/0102839 A1 | 8/2002 | Gonzalez et al. | |
| 2003/0025177 A1 | 2/2003 | Kothandaraman | |
| 2003/0062590 A1 | 4/2003 | Anthony | |
| 2003/0155629 A1 | 8/2003 | Giust et al. | |

* cited by examiner

APPARATUS AND METHOD FOR ELECTRONIC FUSE WITH IMPROVED ESD TOLERANCE

CROSS-REFERENCE TO RELATED APPLICATIONS

The present application is a divisional application of U.S. patent application Ser. No. 11/004,846 filed Dec. 7, 2004, now U.S. Pat. No. 7,334,320 which is a divisional application of U.S. patent application Ser. No. 10/707,282 filed Dec. 3, 2003, now abandoned, the disclosure of these applications is expressly incorporated by reference herein in their entireties.

BACKGROUND OF INVENTION

1. Field of the Invention

The invention generally relates to the optimization of electronic fuses, and more particularly to a method and apparatus for an electronic fuse polysilicon resistor for high current applications and increase resistance to ESD (electrostatic discharge) failure.

2. Background Description

Optimization of a polysilicon electronic fuse element is important for fuse initiation and verification of such initiation, and prevention of failure from ESD events. ESD events can lead to destructive failure of fuse elements.

FIG. 1 illustrates an example of a related art electronic fuse resistor 10 having a salicided polysilicon film 14 overlying a polysilicon film 12. The related art fuse 10 also includes metal contacts 16 in electrical communication with the salicided polysilicon film 14. To maintain a low resistance, the related art electronic fuse 10 is of a relatively narrow width.

FIG. 2 illustrates a cross-section of the related art electronic fuse 10 along line A-A' of FIG. 1. As can be seen in the cross-section, the polysilicon film 12 and the salicided polysilicon film 14 of the related art fuse 10 are about the same width.

Furthermore, the salicided polysilicon film 14 forms a single continuous conductor providing a single current flow path which is distributed over the entire the surface of the polysilicon film 12.

In the related art fuses, the width of the salicided polysilicon film 14 is the same as the width of the polysilicon film 12. Consequently, as the polysilicon film 12 is made larger to withstand larger currents, the salicided polysilicon film 14 becomes larger and requires higher current loads to blow. Conversely, as the salicided polysilicon film 14 is reduced in size to blow at smaller currents, the polysilicon film 12 becomes more susceptible to damage.

As a result, the window in which to blow the salicide film 14 and maintain the integrity of the insulator 12 and related polysilicon line is narrow. In other words, there is a small difference between the minimum current necessary to blow the fuse and the amount of current which will damage the insulator supporting the salicided film 12. As such, the current pulse width to implement the fuse blow is limited to a relatively narrow given time and current domain. Accordingly, a blown fuse may be accompanied by a damaged insulator impairing functioning of the associated circuit.

At electric currents above the critical current-to-failure, the related art polysilicon fuse resistor structure can lead to metal blistering, extrusion and melting.

High current flow through the structure of related art fuses can lead to cracking of the insulator films due to high thermal and mechanical stress. Thermal gradients in the surrounding insulator which may lead to mechanical stresses which exceed the yield stress can lead to insulator cracking. Such cracking can cause loss of integrity of the dielectric and semiconductor chip. Accordingly, related art fuses may malfunction when blowing upon the application of high currents.

Hence, because related art fuses are susceptible to damage due to high currents, a structure which can sustain high currents and maintain structural integrity and yet lead to fuse initiation and removal of the salicide during the fuse initiation is needed.

SUMMARY OF INVENTION

In a first aspect of the invention, an electronic fuse is provided. The electronic fuse includes an insulating film and at least one conductive region partially covering the insulating film. At least one non-conductive region is provided on the insulating film adjacent the conductive region.

In another aspect of the invention, the electronic fuse includes a polysilicon film with a top surface and a conductive film disposed on the top surface of the polysilicon film forming a plurality of separate conductive regions. Non-conductive regions are provided between the plurality of separate conductive regions.

In another aspect of the invention, a method is provided for forming a fuse. The method includes forming and defining an insulator film, and forming at least one conductive region adjacent to at least one non-conductive region on a surface of the insulator film.

DETAILED DESCRIPTION

The invention relates to the optimization of electronic fuses, and more particularly to a method and apparatus for an electronic fuse polysilicon resistor for high current applications and increase resistance to ESD (electrostatic discharge) failure.

In the invention, a conductive region is provided on the surface of an insulator with a non-conductive region adjacent thereto. The insulator may also be a resistor. By positioning a conductive region adjacent to a non-conductive region on the insulator, thermal stress in the insulator due to current flowing through the conductive region is spread over a larger area, thus reducing the localized peak stress in the insulator. With stress reduced in such a manner, higher currents may pass through the conductive region without causing damage to the insulator. Accordingly, the fuse structure tends to maintain its structural integrity at high currents, making it suitable for some types of high current applications.

The invention also divides current into localized flow-paths or conductive regions, and those flow-paths are distributed across the surface of an insulator or resistor. Such a distribution of current over the surface reduces thermal stresses in the insulator or resistor, and reduces the risk of damage to the underlying insulator or resistor substrate in high current applications. Additionally, the structure has a high tolerance to high current and maintains structural and material integrity under high current applications which reduces the possibility of failure due to ESD or high current. The invention also provides an electronic fuse blow resistor structure where structure integrity remains intact after the fuse blows and, additionally, has a well controlled failure process to facilitate distinguishing between an "open" and a "short" circuit. The invention also provides a high tolerance resistor element for high current RF applications.

Figure 1:
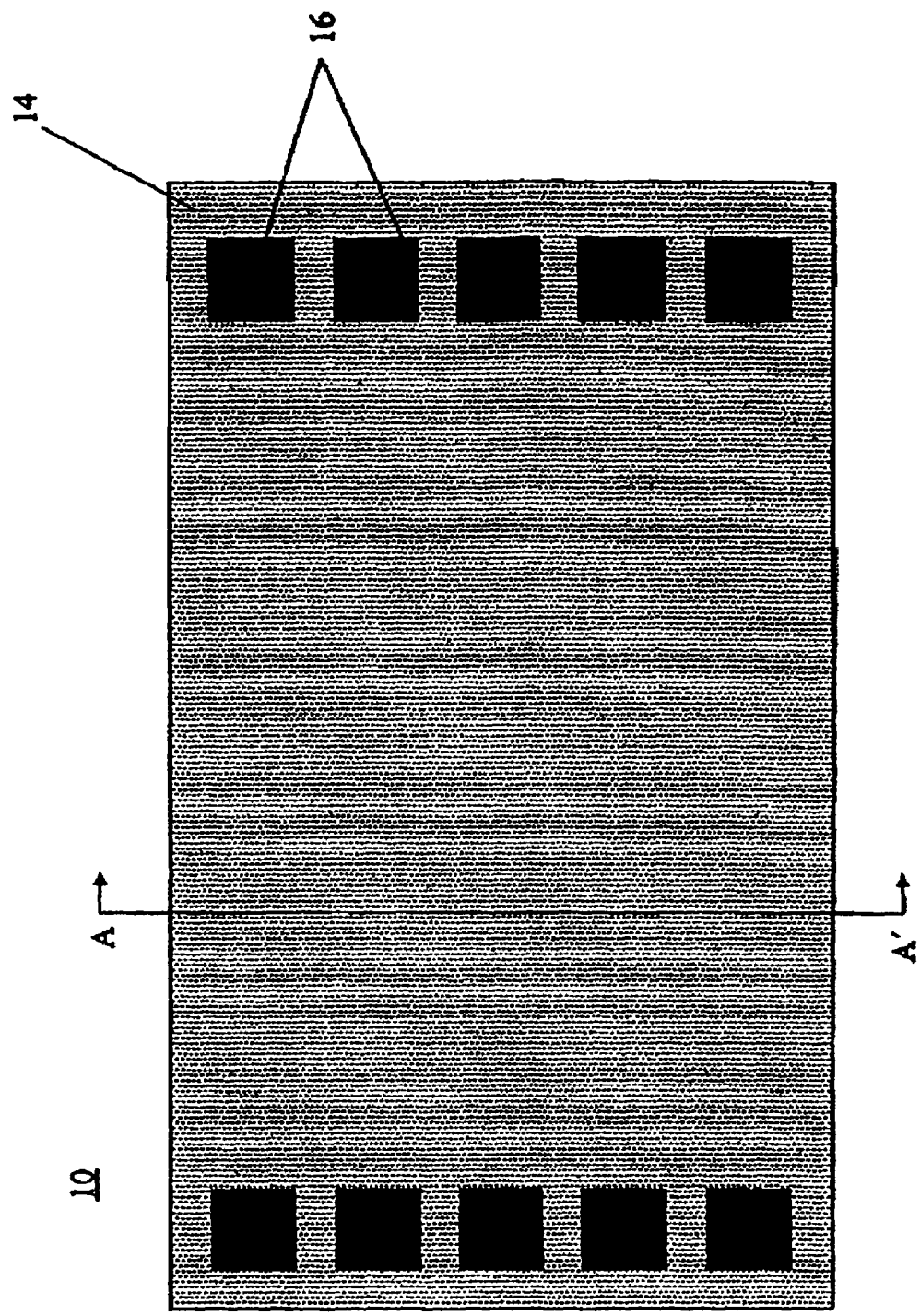
FIG. 1 illustrates a related art electronic fuse resistor structure.
Figure 2:
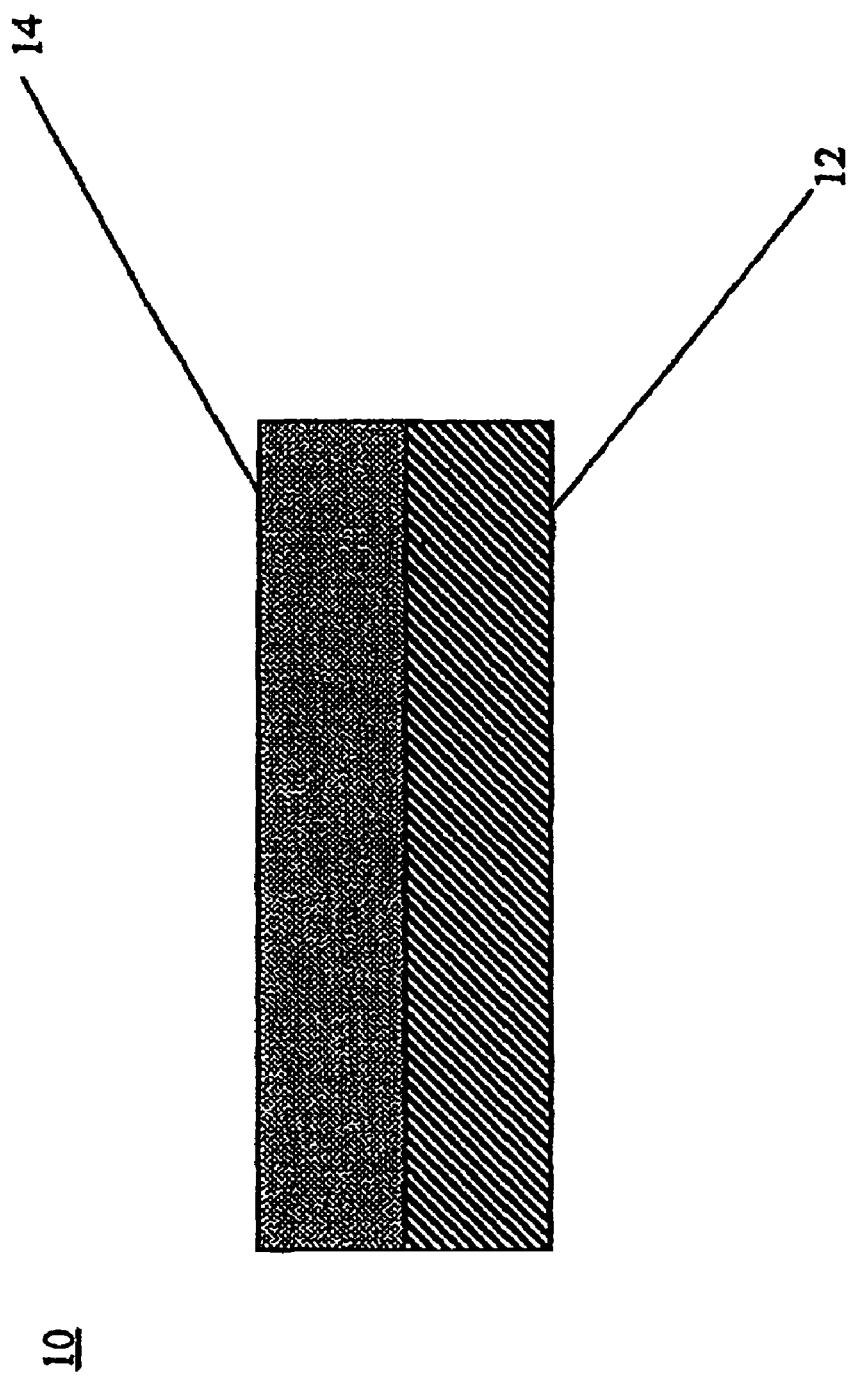
FIG. 2 illustrates a cross-section taken along A-A" of FIG. 1.
Figure 3:
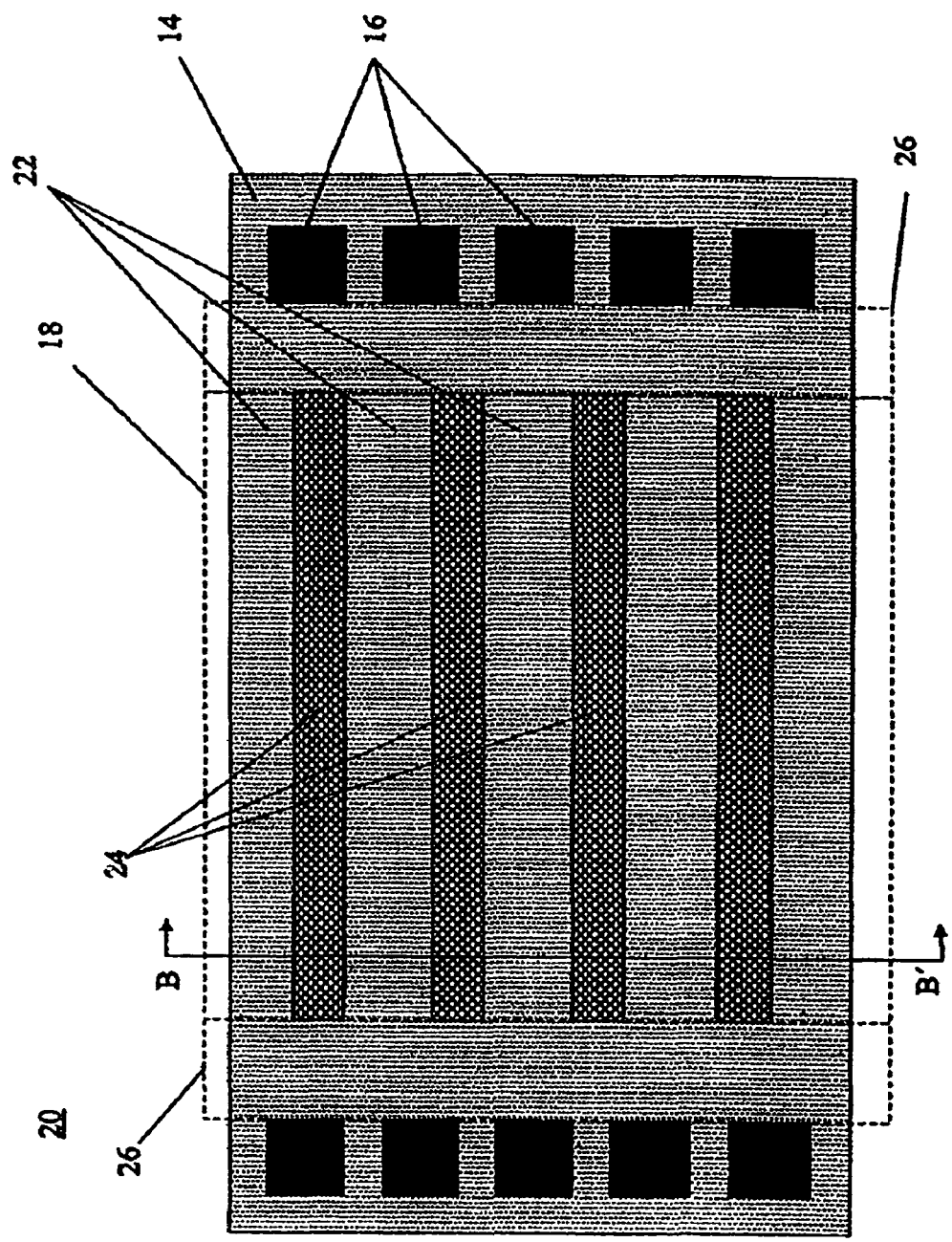
FIG. 3 illustrates an example of an embodiment of the electronic fuse resistor structure.

Referring now to the drawings, FIG. 3 illustrates an example of an embodiment of the invention generally depicted at reference numeral 20. The structure includes a polysilicon film or insulator 12 which supports a fuse 18. The fuse 18 may be defined as including conductive regions or strips 22 or may be the conductive strips in addition to the polysilicon film. The conductive strips 22 are separated from one another by a non-conductive region 24. The insulator 12 also supports fuse leads 26, which are in electrical contact or communication with the conductive strips 22. The structure 20 also includes metal contacts 16 which are in electrical communication with the fuse leads 26. The fuse leads 26 are located at opposite ends of each conductive region 22. The insulator 12 may also be a resistive film forming a resistive element. It should be understood that the fuse may include only one conductive region adjacent to only one non-conductive region.

Although FIG. 3 shows the conductive regions of uniform width and approximately parallel to one another, other conductor patterns are contemplated with use by the invention. For example, some applications may benefit from the conductor having various widths or various lengths relative to one another. Other applications may have the distance between the conductors vary in a prescribed pattern or have a non-parallel pattern. By way of one illustrative example, non parallel strips may be provided.

Figure 4:
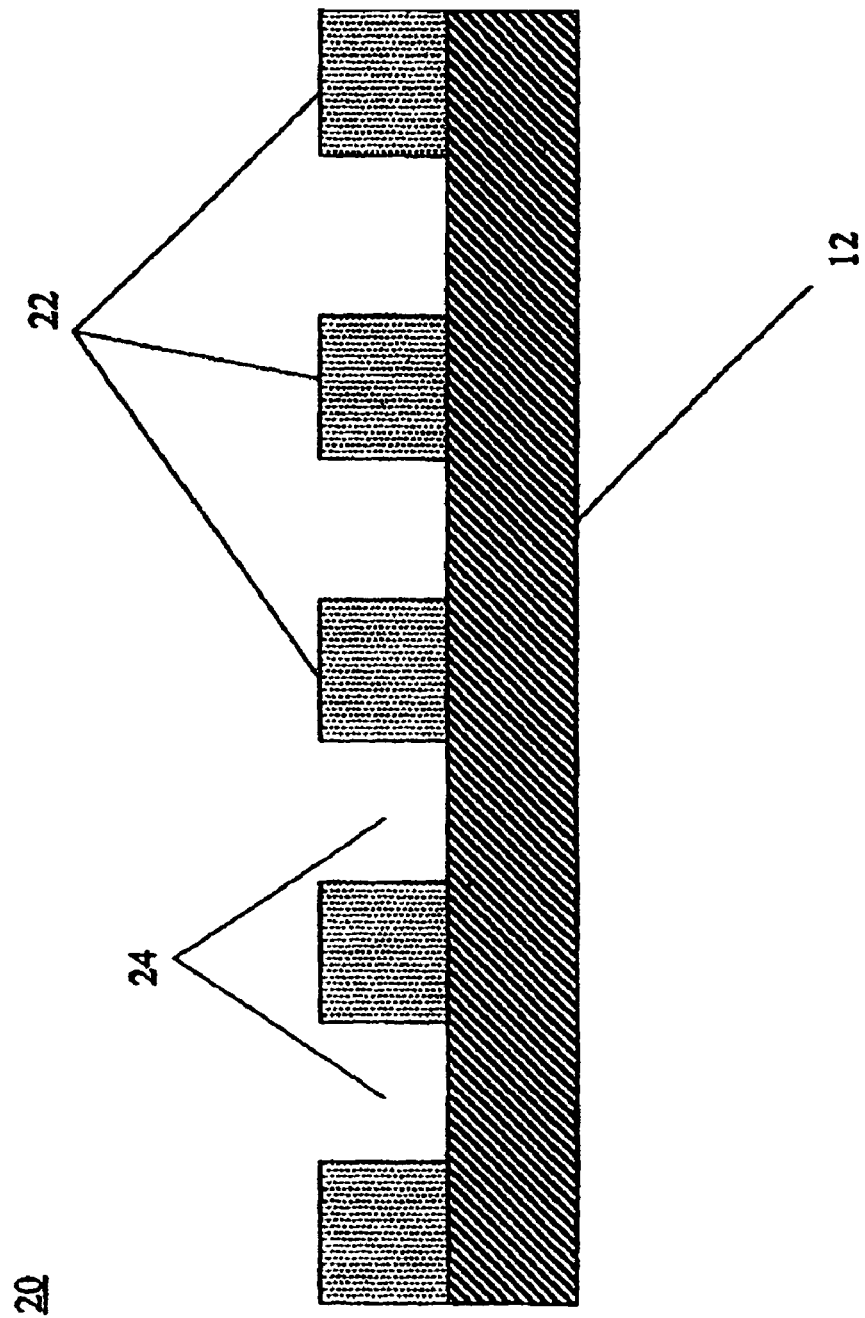
FIG. 4 illustrates a cross-section taken along B-B' of FIG. 3.

FIG. 4 illustrates a cross-section of the embodiment of the invention 20 shown in FIG. 3 taken along line B-B'. As can be seen in the cross-section, conductive regions 22 are positioned on top of the insulator 12. Each conductive region 22 is separated from adjacent conductive regions 22 by a non-conductive region 24.

Where only one conductive region 22 is provided, only one non-conductive region 24 may also be provided. The non conductive region may include known insulation material or an air gap, for instance.

In addition to various the conductor patterns mentioned above, certain embodiments may have conductors of 100 to 400 Å in thickness, for example, with a width and lengths being a function of the application, all depending on the resistance value desired. Additional examples of materials from which to make the conductors include salicided polysilicon and various metals, such as, for example, aluminum, copper, titanium or other refractory materials.

In operation, current flows through metal contacts 16 and a fuse lead 26. The current then flows through the conductive regions or strips 22 to the opposite fuse lead 26 and corresponding metal contact 16. By having multiple conductive regions 22 separated by non-conductive regions 24, current flow is directed along discrete local paths distributed across the top of the insulator 12. Such localized and separate paths of current flow on top of the insulator 12 and reduce thermal stress within the insulator 12. Thus, the insulator 12 can withstand higher levels of current flow through the conductive regions 22 before being stressed to failure. However, because the cross-sectional area of all the conductive regions 22 is still relatively small, the fuse will blow at current levels similar to the related art fuse.

Where the insulator 12 is a polysilicon film or resistor, allowing for a wider polysilicon film or resistor can also lead to the prevention of the polysilicon film or resistor failure. By allowing the polysilicon film to be wider, the failure of the polysilicon film will be lessened because the thermal stresses therein will be reduced. Such a molten filamentation occurs in the polysilicon resistor element when the current exceeds the $P_{crit}$, i.e.; the critical power to failure of the polysilicon film. Such failure can be calculated as follows:

$$V(a)^2 = (12 g_{ox} T_m / g_l d_p d_{ox})(1 - F(a))/(30 - F(a)) \qquad \text{Eq. 1}$$

$$F(a) = \tan h(\alpha(a-w)/2)/\tan h(\alpha a/2) \qquad \text{Eq. 2}$$

$$\alpha^2 = r_{Si} g_{ox} / d_p d_{ox} \qquad \text{Eq. 3}$$

V is voltage, r is resistance, $T_m$ is temperature of a metal, w is width of a line, "a" is a parameter of constriction of the line, $g_{ox}$ is gate conductance, $g_l$ is film conductance, $d_p$ is the thickness of the polysilicon and $d_{ox}$ is the thickness of the oxide.

The failure of polysilicon film is also well determined from ESD testing of unsalicided polysilicon resistor elements. ESD experimental results show that the ESD robustness increases with the width of the polysilicon strip. Hence, the ESD robustness of the element also increases with the width of the polysilicon fuse or resistor. However, by using a salicide block mask to form conductive regions, the current can be limited to the salicide film or conductive regions leading to failure of the conductor without rupture of the polysilicon film or resistor.

The ESD robustness of an individual wire is a function of the cross sectional area. The smaller the cross sectional area of the wire, the lower the ESD robustness, which can lead to improved accuracy of the digitization. It should also be understood that the more strips, at a smaller cross section will also provide more discrete digitization. For example, 20 strips at 5 microns will have a more discrete digitization than 10 strips at 10 microns, even though there is a same cross sectional area. This is because there are more strips that can "blow" thus increasing the stepwise digitization of a device.

The conductive regions of the electronic fuse or resistor are configured so that the electrical resistances will be "digitized" and the resistance will undergo step changes as the number of conductive regions or fingers of the salicide film begins to fail. The digitation of the conductor strips will allow digitized sensing levels which are helpful for digital circuits to determine the failure of one or more of the conductive regions or fingers. In electrical failure, damage can lead to non-uniformities and irregularities in the resistance magnitude. Using conductive regions such as a salicide finger set, the optimization of the circuit and fuse resistance magnitudes will step through the failure points as particular conductive regions rupture or fail. This method may allow an improved sensing scheme well suited to digital circuits.

Figure 5:
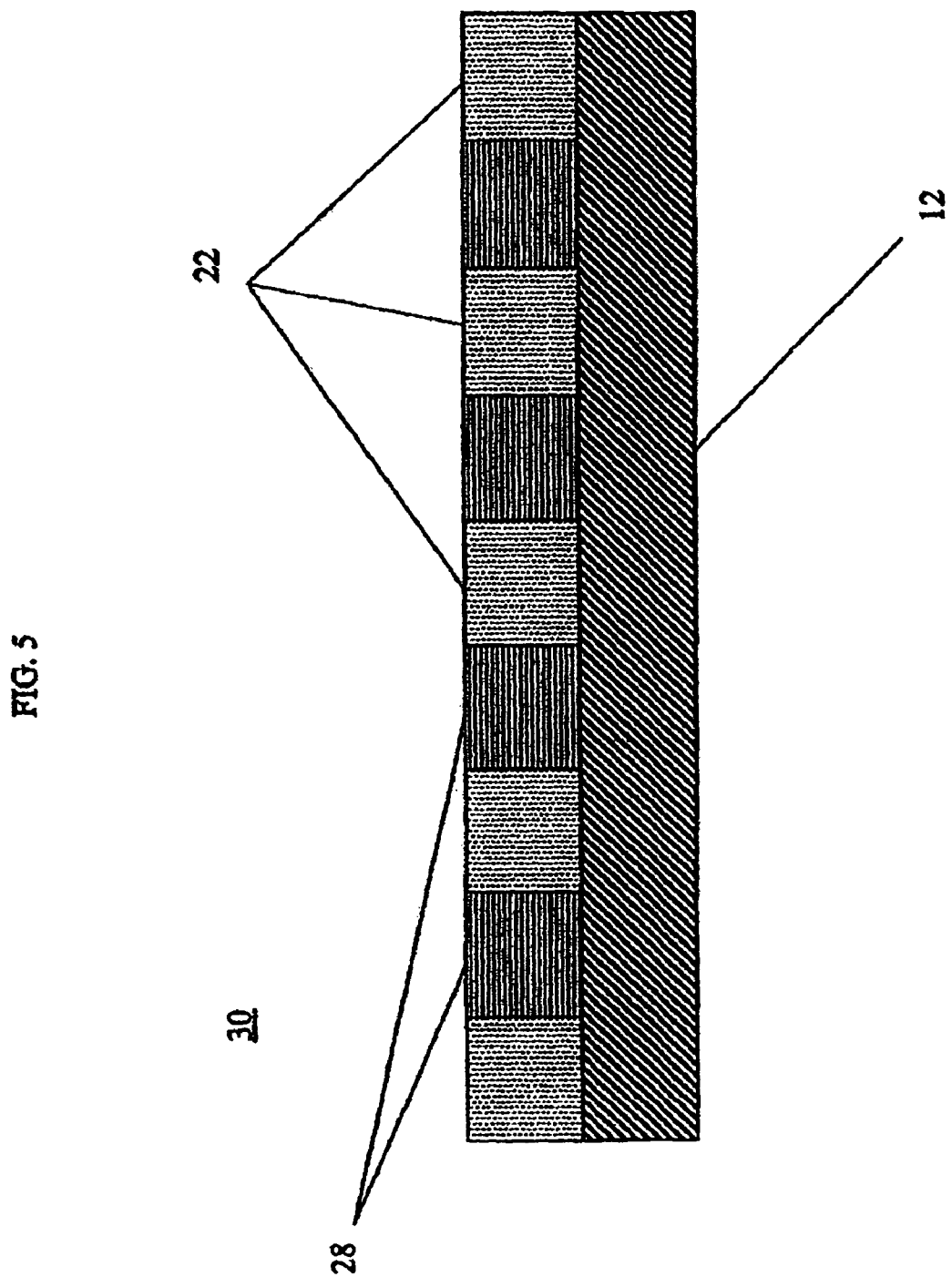
FIG. 5 illustrates a cross-section of another embodiment of the invention.

Referring to FIG. 5, another embodiment of the electronic fuse 30 is shown, where an insulator 12 supports conductive regions 22. The conductive regions 22 have non-conductive regions therebetween which are at least partially filled with a solid, liquid, or semi-solid non-conductive material 28. It should be understood that the non-conductive material 28 may be porous, and in some cases may include a combination of gas, liquid and solid. The non-conductive material 28 may have good electrical insulating properties. In one aspect of the invention, the non-conductive material 28 is resistant to damage due to thermal and mechanical stresses.

Figure 6:
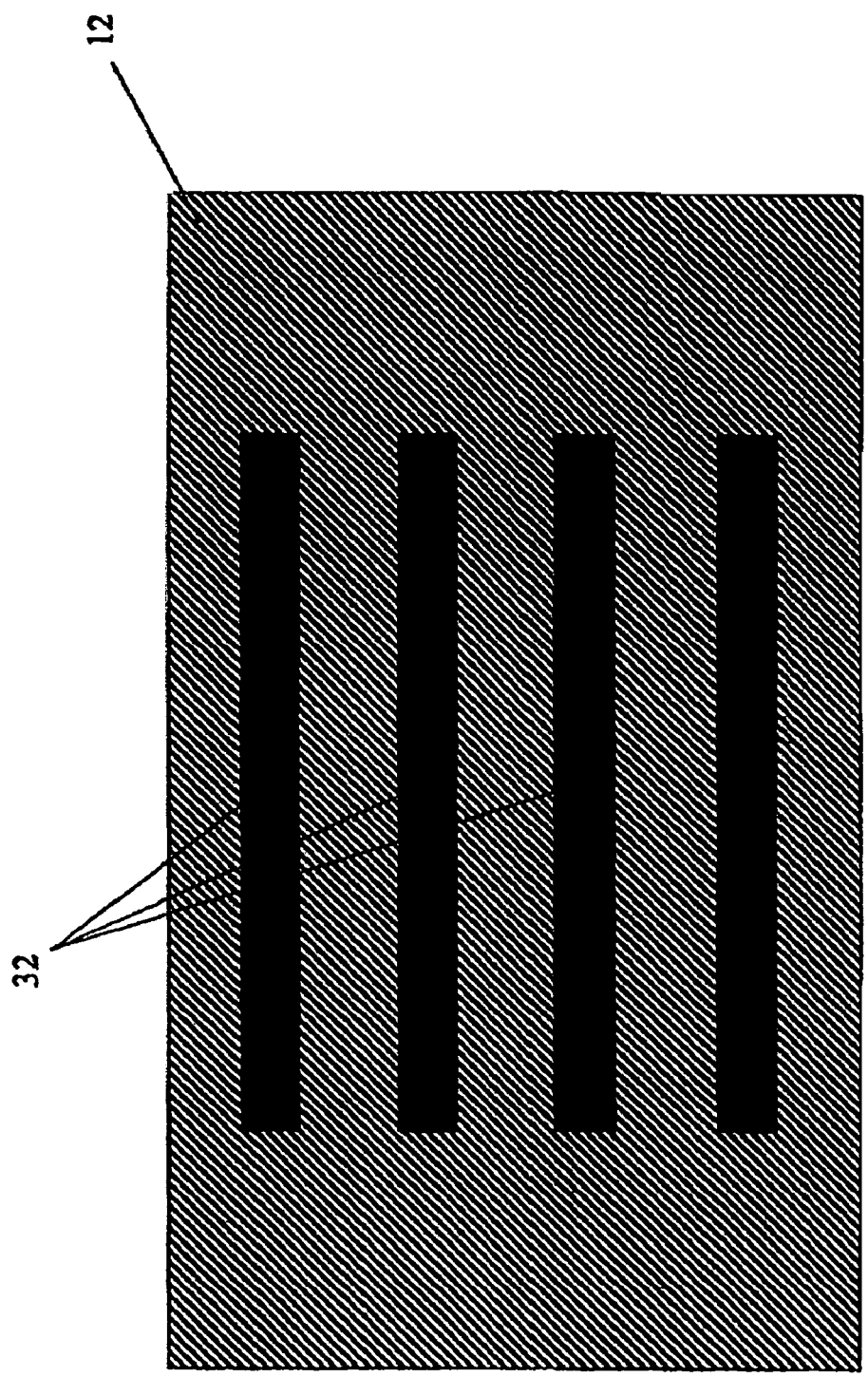
FIG. 6 illustrates a mask for depositing conductive regions on an insulator.

FIG. 6 illustrates a mask on an insulator 12 for forming multiple conductive regions or paths on the surface of the insulator. As in FIGS. 3 and 4, the insulator 12 may also be a resistive material forming a resistive element. By using a salicide block mask, a plurality of salicided regions can be formed on a polysilicon film.

By creation of narrow width parallel conductive regions, current can be constricted to regions on the salicide region without the failure of the underlying insulator or resistor.

In this fashion, the width of the polysilicon fuse or resistor width can be increased as to avoid failure due to thermal stress.

As another example, a salicide block mask may be used to form a set of conductive regions or comb fingers of salicided regions. Such a structure will cause current to flow along narrow stripes of the salicided region. As the current increases, the salicide fingers will blow leading to opening of the fuse with minimized thermal stress in the underlying substrate.

Figure 7:
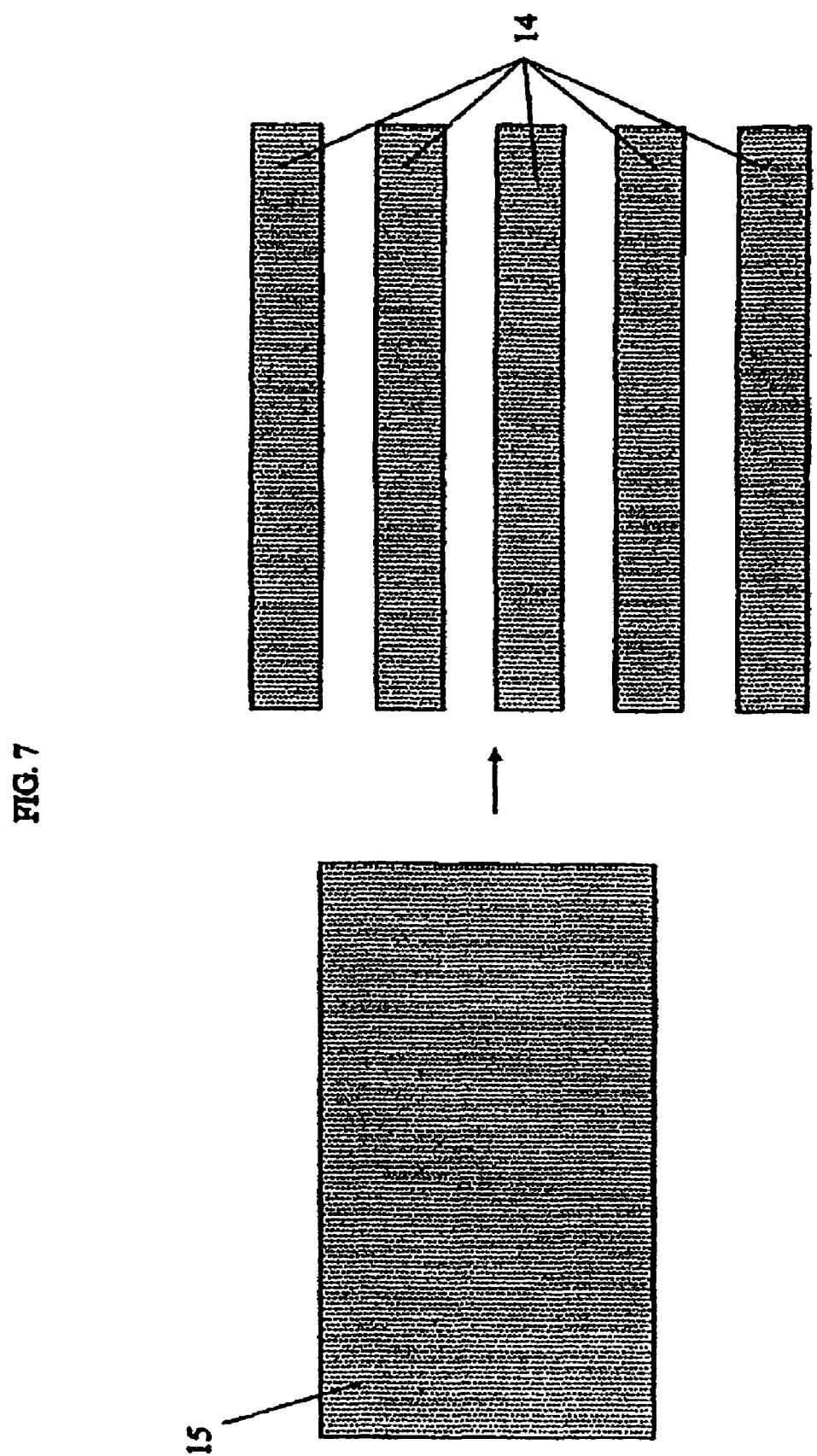
FIG. 7 illustrates forming a conductive film into conductive strips.

Referring to FIG. 7, an illustration of how a conductive sheet 15 can be sub-divided into multiple conductive regions 14 is shown. Thus, by forming the conductive sheet 15 as multiple conductive regions 14, current can be directed along discrete localized paths thereby reducing thermal stresses on any underlining insulator or resistor. However, because the total cross-section of the multiple conductive regions 14 is similar to that of the conductive sheet 15, the current carrying capacity of the multiple conductive regions 14 is comparable to that of the conductive sheet 15. It should be noted that the conductive regions 14 are typically formed by depositing a conductor onto an insulator or resistor on which a mask has been formed to produce the conductive regions 14. The conductive regions 14 may also be formed by etching the conductor to have non-conductive regions.

Figure 8:
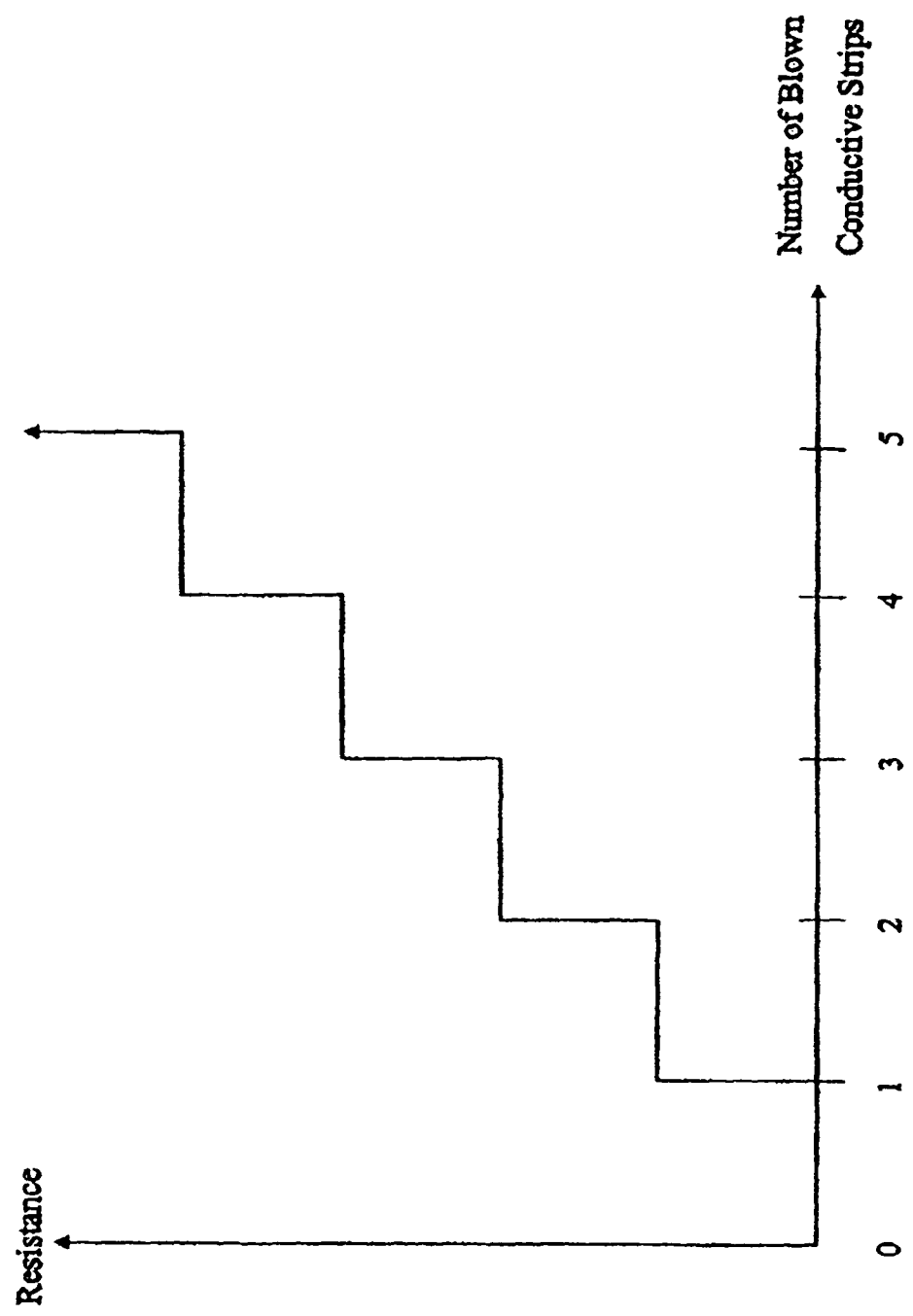
FIG. 8 is a graph of resistance versus number of intact conductive strips for an electronic fuse.

FIG. 8 illustrates the step response change in resistance of the electronic fuse or resistor as conductive regions or strips are blown or ruptured. As shown in the graph, the electronic fuse has the lowest resistance when no conductive strip has been ruptured. When a single conductive region or strip ruptures, the resistance of the fuse increases by a pre-determine amount to a prescribed level. In like manner, as further conductive regions are ruptured the resistance increases stepwise until it reaches a maximum value when all the conductive strips have blown. The change in resistance for each step, and the resistance value for each step may be determined by forming the underlying insulator or resistor film and the conductive regions of suitable materials and dimensions.

By structuring the fuse to blow in discrete steps, the fuse blows in a more predictable manner. Additionally, the fuse will have as many blow-steps as there are conductive regions. The stepwise blowing of the fuse reduces the chance that the fuse will malfunction by partially blowing and still conduct some current. Such a failure mode is further avoided because of the reduced thermal stress in the underlying insulator or resistor film.

Also, because the fuse blows in discrete steps has prescribed changes in resistance, the fuse described herein exhibits discrete resistance values. The discrete resistance values make the device amenable to digital sensing to determine whether it is in a blown or intact state. Additionally, the fuse may function as a programmable resistor having well-characterized resistor value options available to the user.

It should also be understood that the fuse of the invention will be used in a semiconductor environment and can be used in, for example, CMOS technology, Si on Insulator technology or SiGe technologies, to name a few. It is also well understood in the art that the insulator around the structure can be of different thermal conductivities.

While the invention has been described in terms of various embodiments, those skilled in the art will recognize that the invention can be practiced with modification and still remain within the spirit and scope of the appended claims. For example, multiple fuse elements may be combined with multiple resistor elements to form a component which reverts to a specified resistive value in the event of fuse rupture.

What is claimed:

1. A method of making an electronic fuse blow resistor structure, comprising:
forming an insulator film;
depositing a layer of conductor directly on the insulator film;
after the depositing, etching the layer of conductor to form a plurality of spaced apart non-conductive regions and a plurality of spaced-apart conductive regions; and
forming a fuse resistor structure including fuse leads formed on top of respective ends of the conductive regions,
wherein the non-conductive regions and the conductive regions are arranged on a same layer,
wherein the conductive regions comprise conductive strips which direct current flow along discrete paths distributed across a top of the insulator film,
wherein the fuse resistor structure changes in resistance based on a number of the conductive regions that are blown,
wherein the insulator film comprises a polysilicon film,
wherein the fuse resistor structure provides for resistance that undergoes step changes based on the number of the conductive regions that electrically fail, and
wherein the insulator film comprising the polysilicon film satisfies:

$$V(a)^2 = (12 g_{ox} T_m / g_l d_p d_{ox})(1-F(a))/(30-F(a));$$

$$F(a) = \tanh(\alpha(a-w)/2)/\tanh(\alpha a/2); \text{ and}$$

$$\alpha^2 = r_{Si} g_{ox}/d_p d_{ox},$$

where V is voltage, r is resistance, $T_m$ is temperature of a metal, w is width of a line, "a" is a parameter of constriction of the line, $g_{ox}$ is gate conductance, $g_l$ is film conductance, $d_p$ is a thickness of the polysilicon and $d_{ox}$ is a thickness of an oxide.

2. The method of claim 1, further comprising forming a first fuse lead in electrical communication with a first end of the plurality of spaced-apart conductive regions and a second fuse lead in electrical communication with a second end of the plurality of spaced-apart conductive regions.

3. The method of claim 2, further comprising forming at least one electrical contact in electrical communication with the first fuse lead and at least one electrical contact in electrical communication with the second fuse lead.

4. The method of claim 1, wherein the plurality of conductive regions comprises a metal.

5. The method of claim 1, wherein the electronic fuse blow resistor structure comprises a programmable electronic fuse arranged on a resistive insulator film.

6. The method of claim 1, further comprising forming by deposition the fuse leads arranged on opposite sides of and in electrical contact with the plurality of spaced-apart conductive regions.

7. The method of claim 1, wherein the plurality of spaced-apart conductive regions comprise a thickness of 100 to 400 Å.

8. The method of claim 1, wherein the plurality of spaced-apart conductive regions are configured to provide digitized resistance.

9. The method of claim 1, wherein each non conductive region comprises a region at least partially filled with a solid, liquid, or semi-solid non-conductive material.

10. The method of claim 1, wherein each non conductive region comprises a porous material.

11. The method of claim 1, wherein each non conductive region comprises a combination of a gas, a liquid, and a solid.

12. The method of claim 1, wherein the plurality of spaced-apart conductive regions comprise a uniform width and are arranged approximately parallel to one another.

13. The method of claim 1, wherein the plurality of spaced-apart conductive regions comprise salicided regions.

14. The method of claim 1, wherein the conductive strips comprise elongated strips arranged parallel to one another and having a thickness of 100 to 400 Å, and wherein the method further comprises forming by deposition the fuse leads arranged on opposite sides of and in electrical contact with the elongated conductive strips.

15. The method of claim 14, wherein the electronic fuse blow resistor structure comprises a programmable electronic fuse arranged on a resistive insulator film and the plurality of elongated conductive strips are configured to provide the digitized resistance and such that resistance of the programmable electronic fuse changes based on a number of the plurality of elongated conductive strips that are blown.

16. A method of making an electronic fuse blow resistor structure comprising an insulating film and a plurality of spaced-apart conductive regions arranged on the insulating film, the method comprising:
    forming the insulator film;
    forming a conductive sheet;
    sub-dividing the conductive sheet into a single layer having a plurality of conductive regions and non-conductive regions, such that each non-conductive region is arranged between two adjacent conductive regions; and
    forming a fuse resistor structure including first and second fuse leads formed at respective ends of the conductive regions, wherein the first fuse lead contacts a respective first end of each of the plurality of conductive regions, and the second fuse lead contacts a respective second end of each of the plurality of conductive regions,
    wherein the insulator film supports the first and second fuse leads,
    wherein the conductive regions comprise conductive strips which direct current flow along discrete paths distributed across a top of the insulator film,
    wherein the fuse resistor structure changes in resistance based on a number of the conductive regions that are blown,
    wherein the fuse resistor structure provides for resistance that undergoes step changes based on the number of the conductive regions that electrically fail,
    wherein each non conductive region comprises a combination of a gas, a liquid, and a solid,
    wherein the insulator film comprises a polysilicon film, and
    wherein each of the plurality of conductive regions is formed directly on the polysilicon film.

17. The method of claim 16, further comprising forming a first fuse lead in electrical communication with a first end of the plurality of spaced-apart conductive regions and a second fuse lead in electrical communication with a second end of the plurality of spaced-apart conductive regions.

18. The method of claim 17, further comprising forming at least one electrical contact in electrical communication with the first fuse lead and at least one electrical contact in electrical communication with the second fuse lead.

19. The method of claim 16, wherein the plurality of spaced-apart conductive regions comprises a metal.

20. The method of claim 16, wherein the electronic fuse blow resistor structure comprises a programmable electronic fuse arranged on a resistive insulator film.

21. A method of making an electronic fuse blow resistor structure, comprising:
    forming an insulator film;
    depositing a conductor layer over the insulator layer;
    after the depositing, etching the conductor layer to form alternating non-conductive and conductive regions arranged on a common layer, wherein each of the conductive regions is formed directly on the insulator film; and
    forming a first fuse lead in electrical communication with a first end of each of the conductive regions and a second fuse lead in electrical communication with a second end of each of the conductive regions,
    wherein the conductive regions are configured to provide digitized resistance and comprise conductive strips which direct current flow along discrete paths distributed across a top of the insulator film,
    the insulator film comprises a polysilicon film,
    the insulator film supports the first and second fuse leads,
    the fuse resistor structure provides for resistance that undergoes step changes based on the number of the conductive regions that electrically fail,
    each non conductive region comprises a combination of a gas, a liquid, and a solid, and
    the insulator film comprising the polysilicon film satisfies:

$$V(a)^2 = (12 g_{ox} T_m / g_l d_p d_{ox})(1 - F(a))/(30 - F(a));$$

$$F(a) = \tanh(\alpha(a-w)/2)/\tanh(\alpha a/2); \text{ and}$$

$$\alpha^2 = r_{Si} g_{ox}/d_p d_{ox},$$

where V is voltage, r is resistance, $T_m$ is temperature of a metal, w is width of a line, "a" is a parameter of constriction of the line, $g_{ox}$ is gate conductance, $g_l$ is film conductance, $d_p$ is a thickness of the polysilicon and $d_{ox}$ is a thickness of an oxide.

22. A method of making an electronic fuse blow resistor structure comprising an insulating film and a plurality of spaced-apart conductive regions arranged on the insulating film, the method comprising:
    forming the insulator film;
    forming a conductive sheet;
    sub-dividing the conductive sheet into a single layer having a plurality of conductive regions and non-conductive regions, such that each non-conductive region is arranged between two adjacent conductive regions; and
    forming a fuse resistor structure including first and second fuse leads formed at respective ends of the conductive regions, wherein the first fuse lead contacts a respective first end of each of the plurality of conductive regions, and the second fuse lead contacts a respective second end of each of the plurality of conductive regions,
    wherein the insulator film supports the first and second fuse leads,
    wherein the conductive regions comprise conductive strips which direct current flow along discrete paths distributed across a top of the insulator film, wherein the fuse resistor structure changes in resistance based on a number of the conductive regions that are blown, wherein the fuse resistor structure provides for resistance that undergoes step changes based on the number of the conductive regions that electrically fail, wherein each non conductive region comprises a combination of a gas, a liquid, and a solid, wherein the insulator film comprises a polysilicon film, wherein each of the plurality of conductive regions is formed directly on the polysilicon film, and wherein the insulator film comprising the polysilicon film satisfies:

$$V(a)^2 = (12 g_{ox} T_m / g_l d_p d_{ox})(1-F(a))/(30-F(a));$$

$$F(a) = \tanh(\alpha(a-w)/2)/\tanh(\alpha a/2); \text{ and}$$

$$\alpha^2 = r_{Si} g_{ox} / d_p d_{ox},$$

where V is voltage, r is resistance, $T_m$, is temperature of a metal, w is width of a line, "a" is a parameter of constriction of the line, $g_{ox}$ is gate conductance, $g_l$ is film conductance, $d_p$ is a thickness of the polysilicon and $d_{ox}$ is a thickness of an oxide.

* * * * *